US012075676B2

(12) United States Patent
Ma et al.

(10) Patent No.: US 12,075,676 B2
(45) Date of Patent: Aug. 27, 2024

(54) PIXEL ARRANGEMENT STRUCTURE AND DISPLAY PANEL

(71) Applicant: YUNGU (GU'AN) TECHNOLOGY CO., LTD., Hebei (CN)

(72) Inventors: Tian Ma, Kunshan (CN); Xiaopeng Lv, Kunshan (CN); Mingxing Liu, Kunshan (CN)

(73) Assignee: YUNGU (GU'AN) TECHNOLOGY CO., LTD., Langfant (CN)

( * ) Notice: Subject to any disclaimer, the term of this patent is extended or adjusted under 35 U.S.C. 154(b) by 383 days.

(21) Appl. No.: 17/480,075

(22) Filed: Sep. 20, 2021

(65) Prior Publication Data

US 2022/0005881 A1  Jan. 6, 2022

Related U.S. Application Data

(63) Continuation of application No. PCT/CN2020/086827, filed on Apr. 24, 2020.

(30) Foreign Application Priority Data

Aug. 2, 2019 (CN) .......................... 201910711114.X

(51) Int. Cl.
H10K 59/35 (2023.01)
(52) U.S. Cl.
CPC ......... H10K 59/352 (2023.02); H10K 59/353 (2023.02)
(58) Field of Classification Search
CPC ........................... H10K 59/352; H10K 59/353
See application file for complete search history.

(56) References Cited

U.S. PATENT DOCUMENTS

2016/0284769 A1\* 9/2016 Chien ................. H10K 59/352
2019/0108793 A1   4/2019 Kim et al.
(Continued)

FOREIGN PATENT DOCUMENTS

CN  104637987 A  5/2015
CN  204991713 U  1/2016
(Continued)

OTHER PUBLICATIONS

International Search Report and Written Opinion (International Application No. PCT/CN2020/086827) with English Translation, dated Jul. 22, 2020, 13 pages.
(Continued)

*Primary Examiner* — Monica D Harrison
*Assistant Examiner* — Andre C Stevenson
(74) *Attorney, Agent, or Firm* — Quarles & Brady LLP

(57) ABSTRACT

A pixel arrangement structure and a display panel. The pixel arrangement structure includes a plurality of pixel units. Each of the pixel units includes at least one pixel group. Each pixel group comprises one first sub-pixel, one second sub-pixel, and two third sub-pixels. The first sub-pixel, the second sub-pixel, and the two third sub-pixels in the pixel group form a virtual quadrilateral. A longest edge of first sub-pixel is arranged to at least partially overlap a first side of the virtual quadrilateral. A longest edge of the second sub-pixel is arranged to at least partially overlap a second side of the virtual quadrilateral. The first edge and the second edge intersect with each other. The pixel arrangement structure increases a pixel density, namely, increases a number of pixels per inch in the display panel, thus a display resolution of the display panel is improved.

20 Claims, 11 Drawing Sheets

(56) References Cited

U.S. PATENT DOCUMENTS

2019/0296093 A1\* 9/2019 Liu .................. H10K 59/353
2020/0075687 A1\* 3/2020 He .................. H10K 59/351

FOREIGN PATENT DOCUMENTS

| CN | 106298833 | A | 1/2017 |
| CN | 106469743 | A | 3/2017 |
| CN | 106935612 | A | 7/2017 |
| CN | 106935616 | A | 7/2017 |
| CN | 107871759 | A | 4/2018 |
| CN | 207398149 | U | 5/2018 |
| CN | 108511480 | A | 9/2018 |
| CN | 109004000 | A | 12/2018 |
| CN | 109148543 | A | 1/2019 |
| CN | 109524449 | A | 3/2019 |
| CN | 106449710 | | 5/2019 |
| CN | 110444569 | A | 11/2019 |

OTHER PUBLICATIONS

Chinese First Office Action 100191 (CN Application No. 201910711114.X) and Search Result with English Translation, dated Mar. 3, 2020, 17 pages.
Chinese Second Office Action 100191 (CN Application No. 201910711114.X) with English Translation, dated Jul. 9, 2020, 21 pages.
Chinese Third Office Action 100191 (CN Application No. 201910711114.X) with English Translation, dated Mar. 3, 2022, 12 pages.

\* cited by examiner

US 12,075,676 B2

PIXEL ARRANGEMENT STRUCTURE AND DISPLAY PANEL

CROSS-REFERENCE TO RELATED APPLICATION

This application is a continuation of international patent application PCT/CN2020/086827, filed on Apr. 24, 2020, which claims the benefit of Chinese Patent Application No. 201910711114.X, filed on Aug. 2, 2019. The contents of both applications are also hereby incorporated by reference in their entireties.

TECHNICAL FIELD

The present disclosure relates to the field of display technologies.

BACKGROUND

Organic Light-Emitting Display (OLED) is regarded as the most promising new flat panel display technology of the next generation. A way to make it be colorized is to evaporate sub-pixels of three materials of R, G, and B (Red, Green, Blue, RGB for short) to form a pixel structure. As people now have higher requirements for visual effects, the design of the display effect of the display panel needs to be fully improved. The improvement of the display effect is closely related to the pixel arrangement structure of the display panel. In related solutions, pixels are generally arranged in an RGB manner, and the resulting RGB pixel density is relatively low, which makes it difficult to increase the resolution of the screen.

SUMMARY

Based on this, it is necessary to provide a pixel arrangement structure and a display panel in view of the problem of low resolution of the screen in related solutions.

A pixel arrangement structure includes a plurality of pixel units, each of the pixel units includes at least one pixel group. Each of the at least one pixel group includes: one first sub-pixel, one second sub-pixel, and two third sub-pixels, which are all located in a virtual quadrilateral. A longest side of the first sub-pixel is arranged to at least partially overlap a first side of the virtual quadrilateral. A longest side of the second sub-pixel is arranged to at least partially overlap a second side of the virtual quadrilateral. The first side and the second side of the virtual quadrilateral intersect with each other.

A display panel includes: a substrate and the above-mentioned pixel arrangement structure. The pixel arrangement structure is arranged on the substrate.

The present disclosure provides the pixel arrangement structure and the display panel. The pixel arrangement structure includes the plurality of pixel units, and each of the pixel units includes at least one pixel group. The pixel group includes one first sub-pixel, one second sub-pixel, and two third sub-pixels. Four sub-pixels in each pixel group are all located in the virtual quadrilateral. The longest side of the first sub-pixel at least partially overlaps the first side of the virtual quadrilateral. The longest side of the second sub-pixel at least partially overlaps the second side of the virtual quadrilateral. The first side and the second side of the virtual quadrilateral intersect with each other. The pixel arrangement structure increases the pixel density, that is, increases the number of the pixels per inch in the display panel, thus improving the display resolution of the display panel.

DETAILED DESCRIPTION

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. All other embodiments obtained by a person of ordinary skill in the art based on the embodiments in the present disclosure without creative efforts are within the scope of the present disclosure.

As discussed in the background, pixels are generally arranged in an RGB manner, and the resulting RGB pixel density is relatively low, which makes it difficult to increase the resolution of the screen. In the present disclosure, the area of the display panel is fully used, and the pixel arrangement structure is reasonably arranged, so as to maximize the number of pixels per inch.

Figure 1:
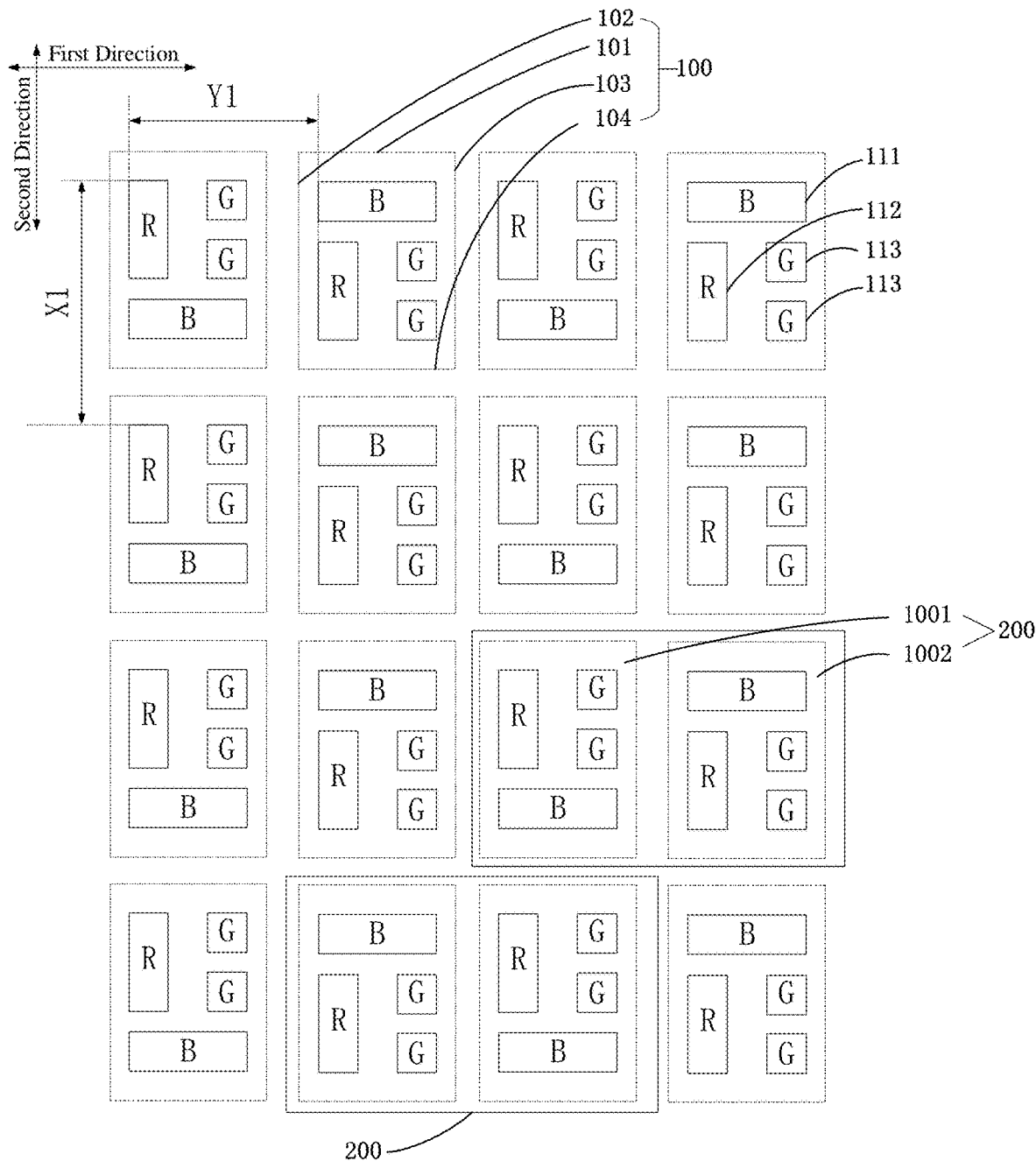
FIG. 1 is a schematic diagram illustrating a pixel arrangement structure according to an embodiment of the present disclosure.
Figure 2:
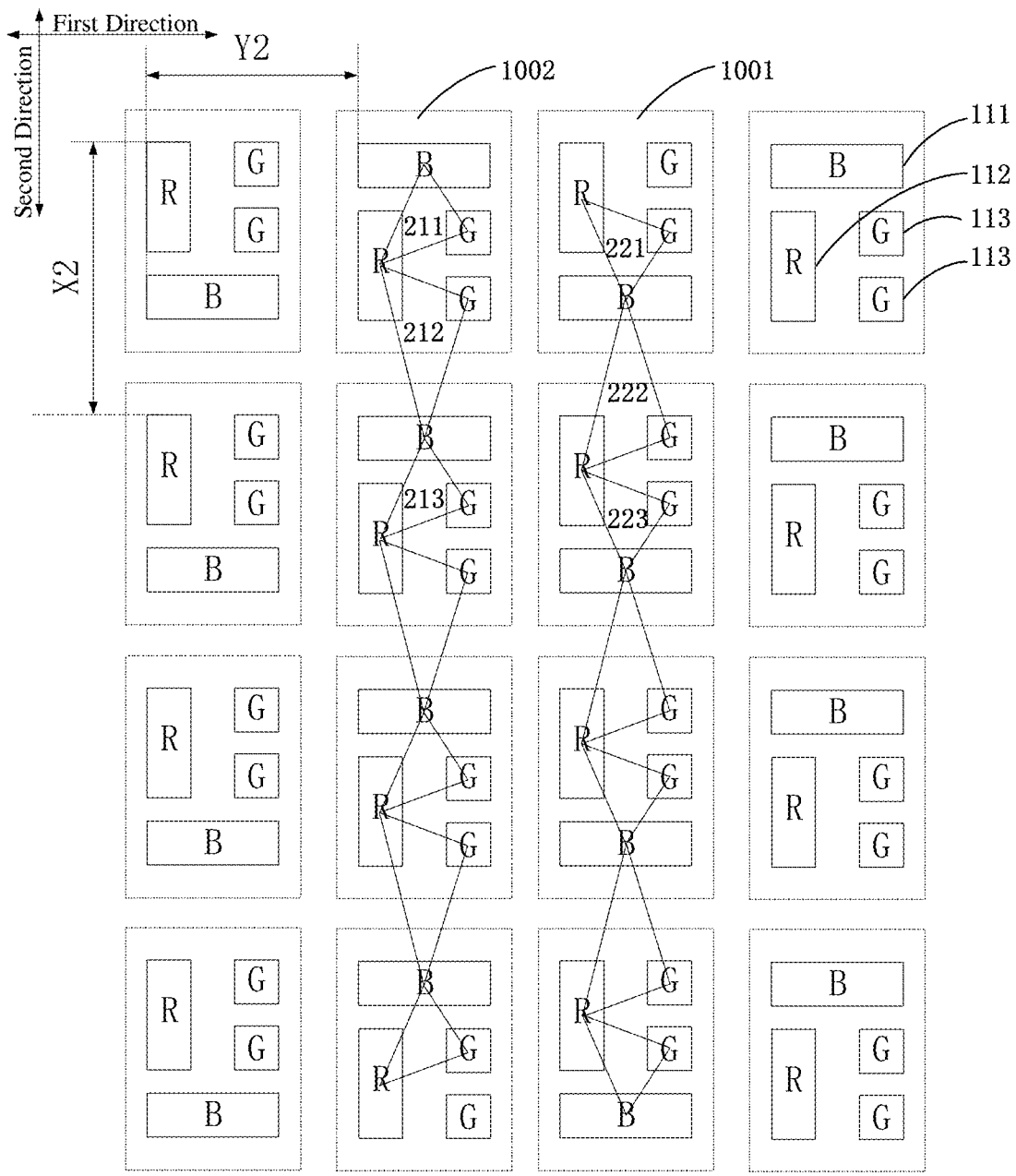
FIG. 2 is a schematic diagram illustrating a layout of sub-pixel units of a pixel arrangement structure according to an embodiment of the present disclosure.
Figure 3:
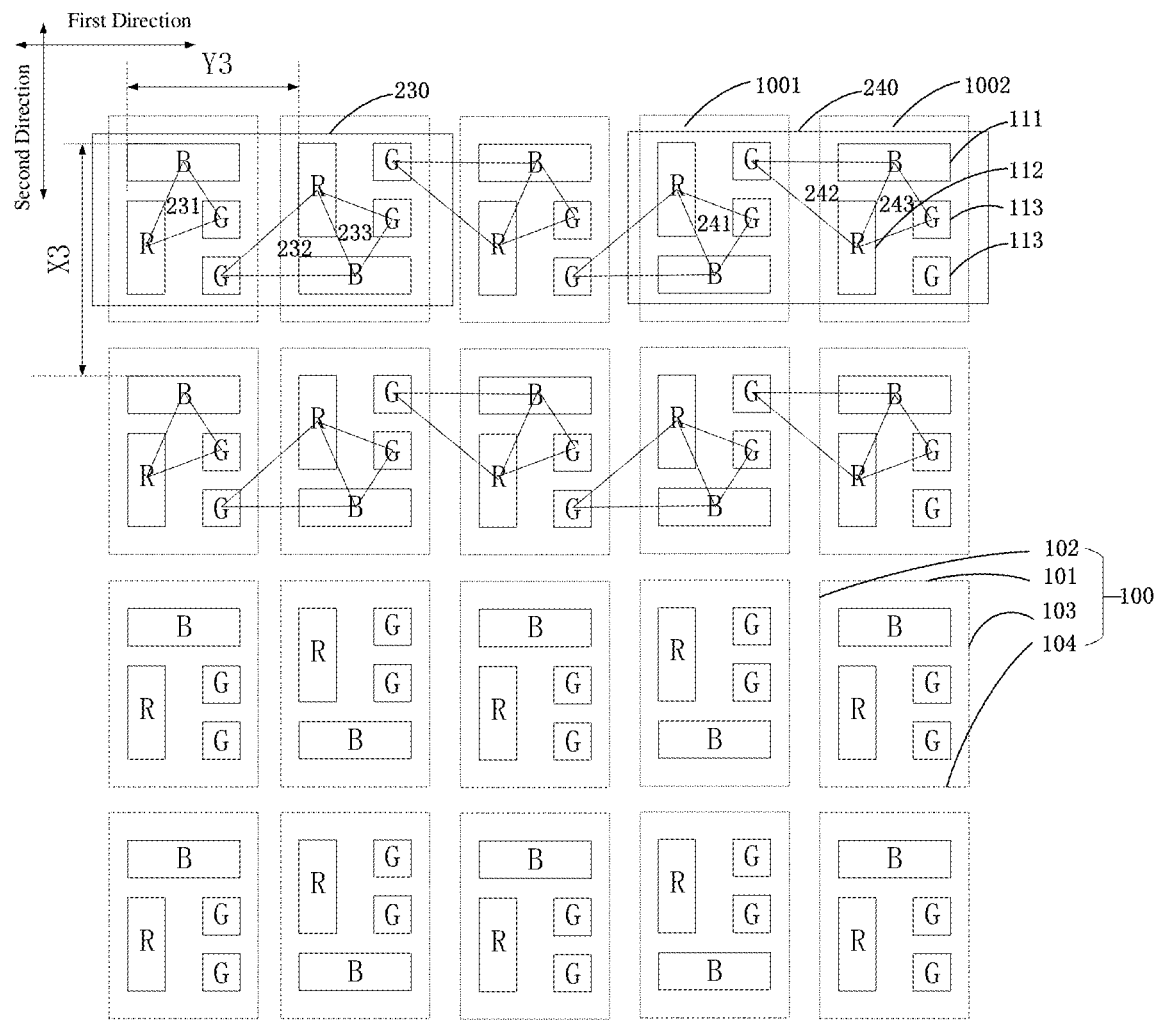
FIG. 3 is a schematic diagram illustrating a layout of sub-pixel units of a pixel arrangement structure according to an embodiment of the present disclosure.
Figure 4:
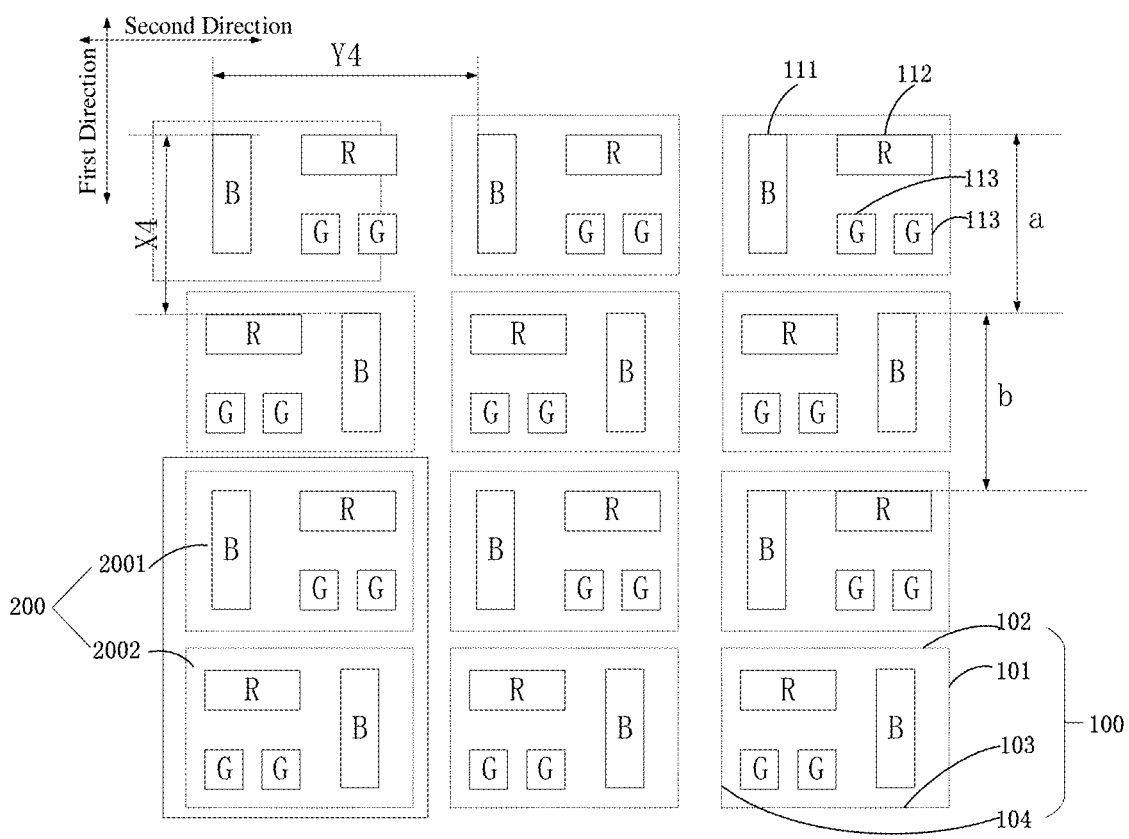
FIG. 4 is a schematic diagram illustrating a pixel arrangement structure according to an embodiment of the present disclosure.
Figure 5:
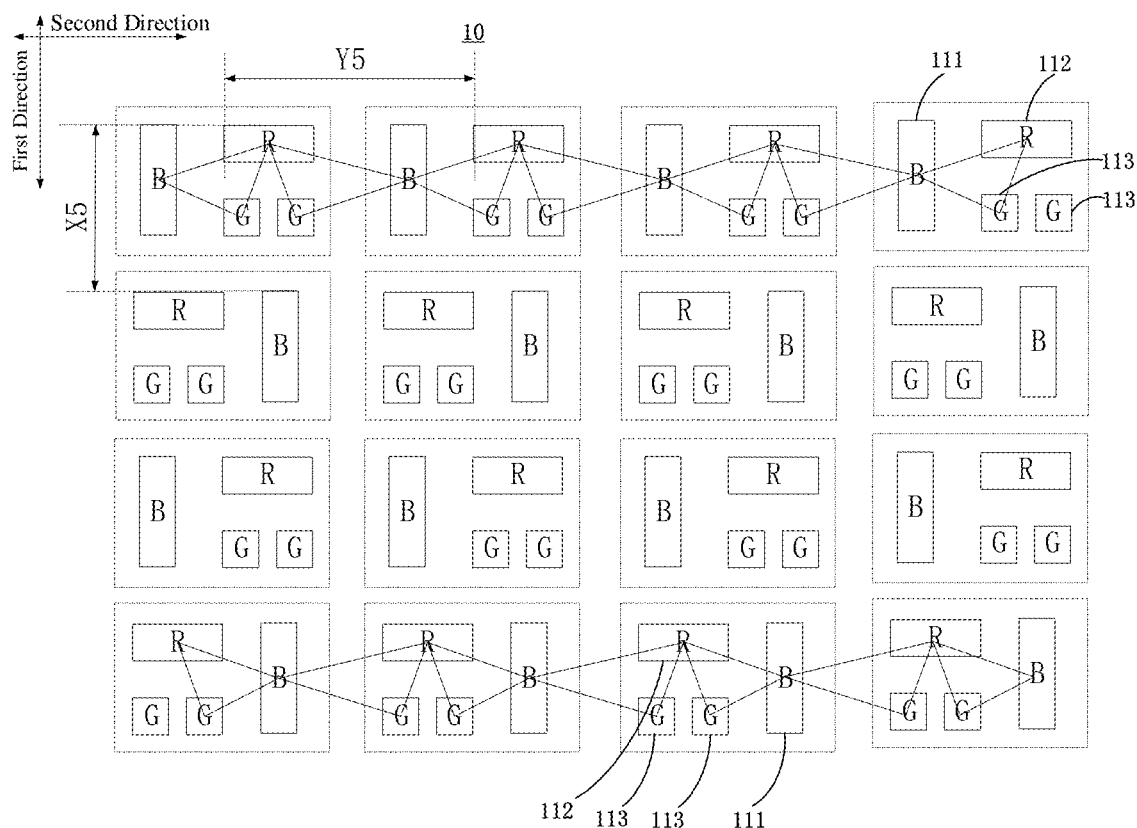
FIG. 5 is a schematic diagram illustrating a layout of sub-pixel units of a pixel arrangement structure according to an embodiment of the present disclosure.
Figure 6:
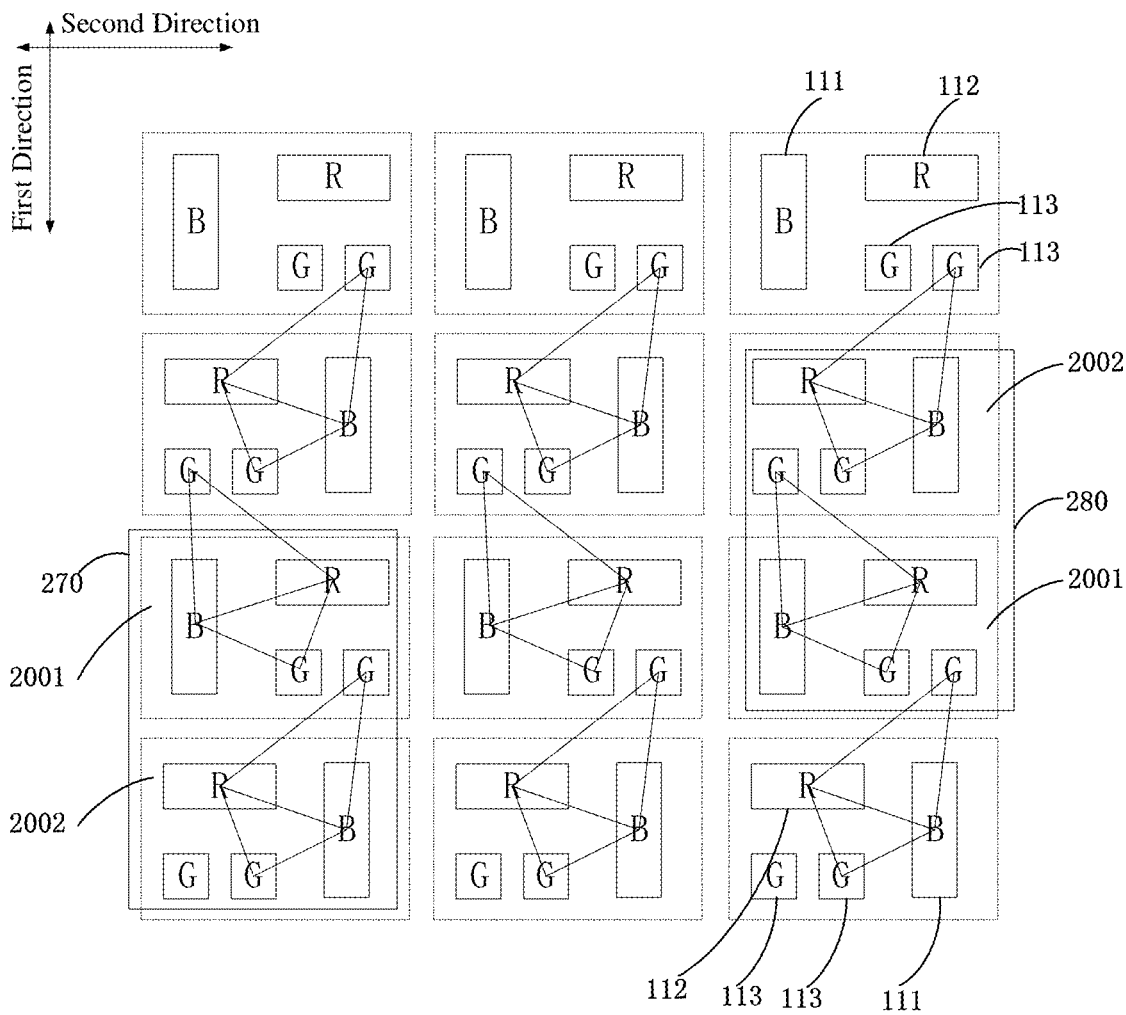
FIG. 6 is a schematic diagram illustrating a layout of sub-pixel units of a pixel arrangement structure according to an embodiment of the present disclosure.
Figure 11:
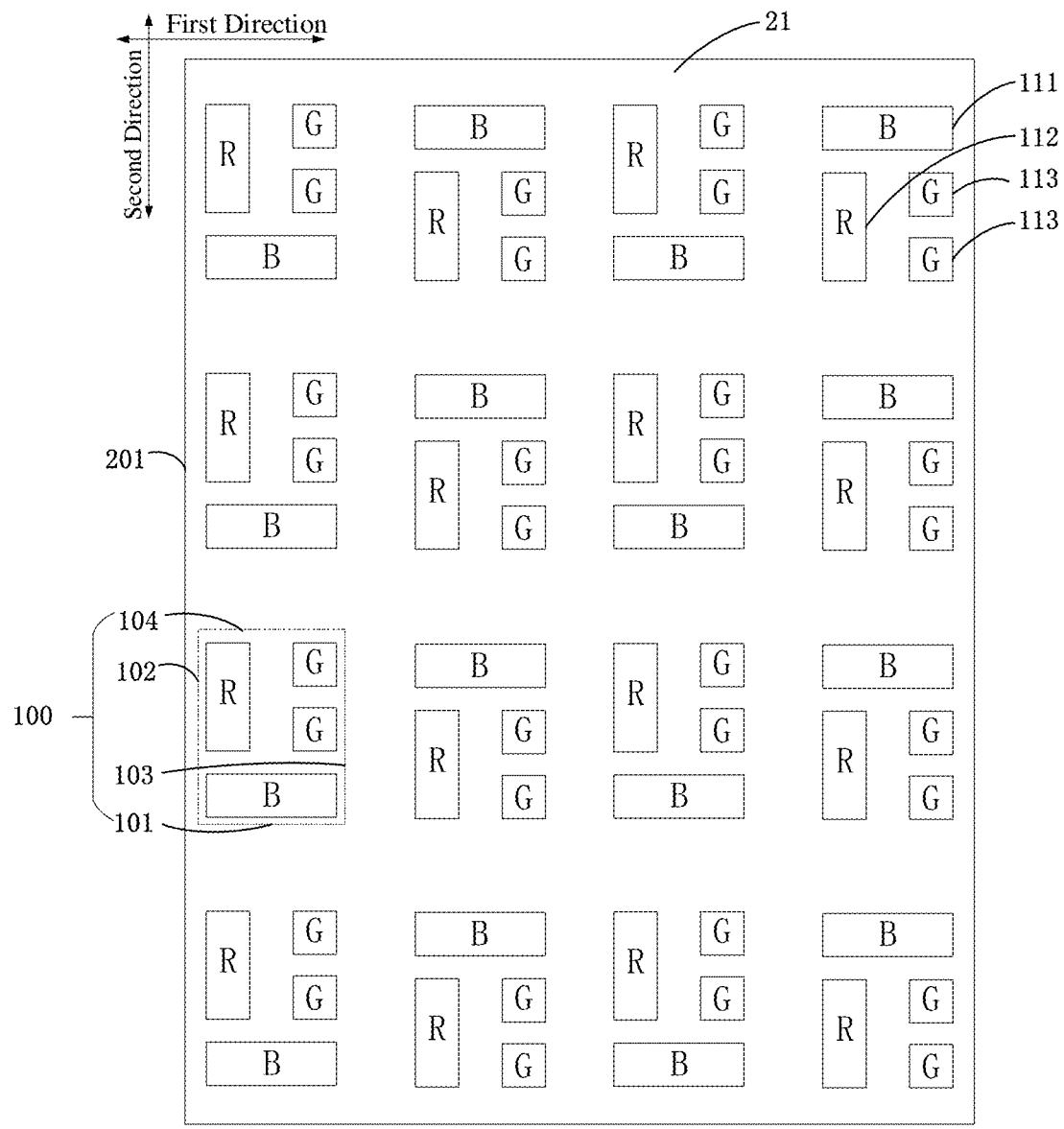
FIG. 11 is a schematic diagram illustrating a structure of a display panel according to an embodiment of the present disclosure.

The pixel arrangement structure and the display panel provided by the present disclosure can achieve a higher display resolution. FIGS. 1 and 4 of the present disclosure show two specific pixel arrangement structures. FIGS. 2 and 3 are schematic diagrams of two driving control manners or schematic diagrams illustrating layouts of sub-pixel units provided for the embodiment of the pixel arrangement structure shown in FIG. 1. FIGS. 5 and 6 are schematic diagrams of two driving control manners or schematic diagrams illustrating layouts of sub-pixel units provided for the embodiment of the pixel arrangement structure shown in FIG. 4. FIGS. 7 to 10 each are a schematic diagram illustrating a structure of a pixel group. FIG. 11 is a schematic diagram illustrating a structure of a display panel. In the embodiments shown in FIGS. 1-3, 7, and 9-11, the first direction is a horizontal direction in the figures, and the second direction is a vertical direction in the figures. In the embodiments shown in FIGS. 4-6 and 8, the first direction is a vertical direction in the figures, and the second direction is a horizontal direction in the figures.

Please refer to FIGS. 1 and 4, the present disclosure provides a pixel arrangement structure 10. The pixel arrangement structure 10 includes a plurality of pixel units 200, and each of the pixel units 200 includes at least one pixel group.

Each pixel group includes: one first sub-pixel 111, one second sub-pixel 112, and two third sub-pixels 113. The four sub-pixels in each pixel group form a virtual quadrilateral 100. The virtual quadrilateral 100 includes a first side 101, a second side 102, a third side 103, and a fourth side 104. A longest side of the first sub-pixel 111 is arranged to at least partially overlap the first side 101 of the virtual quadrilateral 100. The first side 101 and the second side 102 intersect. The first side 101 and the fourth side 104 are opposite to each other, and the third side 103 and the second side 102 are opposite to each other. In order to clearly illustrate the virtual quadrilateral 100, a side of the virtual quadrilateral 100 and a side of a corresponding sub-pixel, which overlap or partially overlap each other, are drawn to be spaced a certain distance apart in the figure. In an embodiment, a longest side of the first sub-pixel 111 is arranged to completely overlap the first side 101 of the virtual quadrilateral 100. A longest side of the second sub-pixel 112 is arranged to at least partially overlap the second side 102 of the virtual quadrilateral 100. In an embodiment, the longest side of the second sub-pixel 112 is arranged to completely overlap the second side 102 of the virtual quadrilateral 100. In an embodiment, the first side 101 is perpendicular to the second side 102. In this case, the virtual quadrilateral 100 is a rectangle or a square.

In each of the pixel groups, sizes and shapes of the four sub-pixels can be configured arbitrarily, and colors of the four sub-pixels can be configured arbitrarily. In an embodiment, the colors of the four sub-pixels may be red, green, and blue. In an embodiment, the colors of the four sub-pixels may also be white, yellow, or other compensation colors.

In an embodiment, the length/width direction of the first sub-pixel 111 and the width/length direction of the second sub-pixel 112 in the pixel group are configured to intersect with each other, specifically to be perpendicular to each other. Each of the pixel groups forms one corresponding virtual quadrilateral 100. In the virtual quadrilateral 100, two third sub-pixels 113 are disposed at a position where no first sub-pixel 111 and no second sub-pixel 112 are disposed. In this embodiment, in the provided design scheme, the sub-pixels are reasonably arranged, so that the pixel arrangement structure 10 is more compact. When the pixel arrangement structure 10 is applied to a display panel, the resolution namely the pixels per inch (PPI) of the display panel can be significantly improved.

Referring to FIGS. 1 and 4, in an embodiment, on the basis of the foregoing implementations, each of the pixel units 200 is two pixel groups arranged along the first direction, which are a first pixel group 1001, 2001 and a second pixel group 1002, 2002 respectively. After the first pixel group rotates for 180 degrees as a whole, the pixel arrangement of the first pixel group 1001, 2001 is mirror-symmetrical to the pixel arrangement of the second pixel group 1002, 2002.

In this embodiment, it can be understood that, for two pixel groups of one same pixel unit 200, in a plane, after the first pixel group rotates for 180 degrees around a center of the first pixel group, the pixel arrangement of the first pixel group is mirror-symmetrical to the pixel arrangement of the second pixel group. In other words, after the first pixel group rotates for 180 degrees clockwise in the plane, the pixel arrangement of the first pixel group is mirror-symmetrical to the pixel arrangement of the second pixel group.

Figure 7:
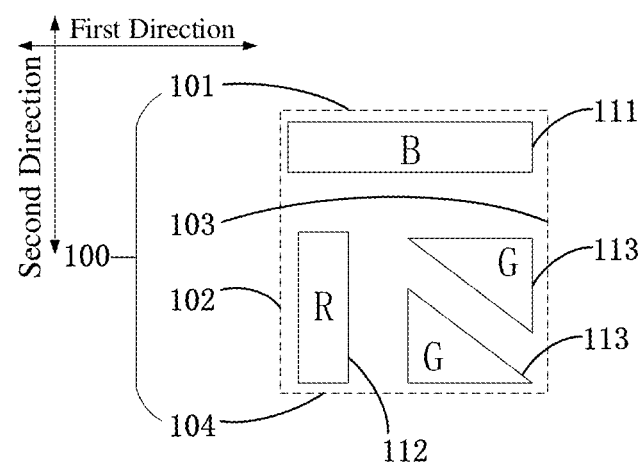
FIG. 7 is a schematic diagram illustrating a pixel group according to an embodiment of the present disclosure.
Figure 8:
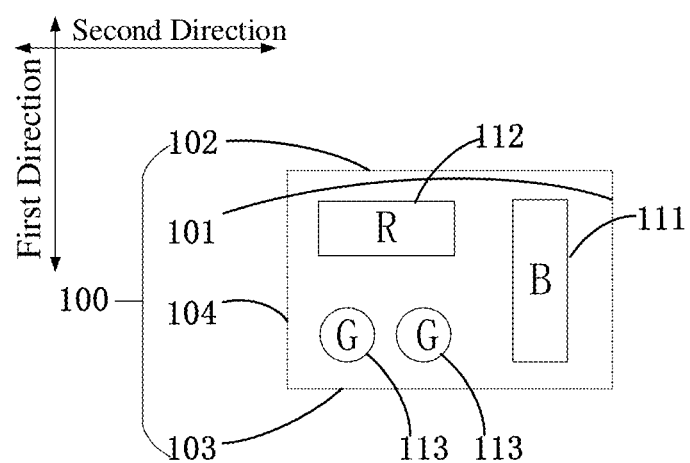
FIG. 8 is a schematic diagram illustrating a pixel group according to an embodiment of the present disclosure.
Figure 9:
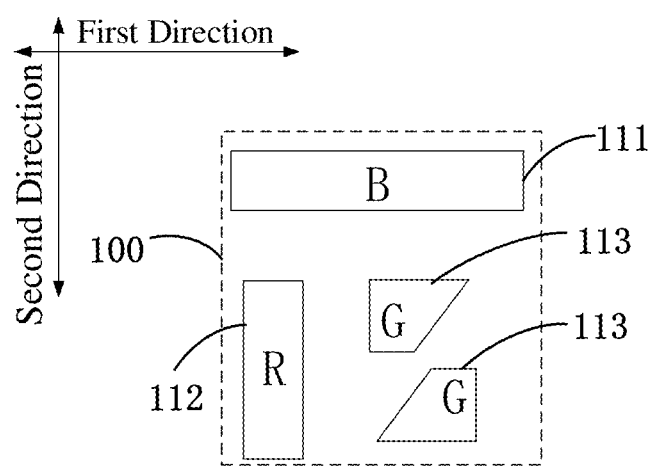
FIG. 9 is a schematic diagram illustrating a pixel group according to an embodiment of the present disclosure.
Figure 10:
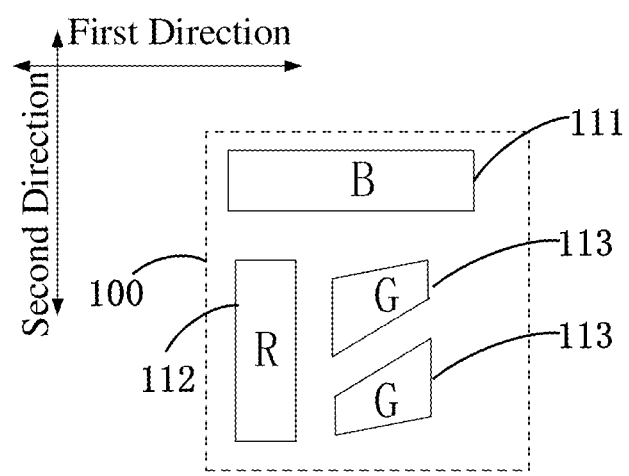
FIG. 10 is a schematic diagram illustrating a pixel group according to an embodiment of the present disclosure.

In an embodiment, the plurality of pixel units 200 are arranged in an array, and the first direction is parallel to an extending direction of the first side 101. As shown in FIG. 1, the first direction is the row direction of the pixel unit array, and as shown in FIG. 7, the direction of the first side 101 is the row direction of the pixel unit array.

In this embodiment, it is specifically limited that the first direction is parallel to the extending direction of the first side 101, so that the pixel arrangement structure is more compact and orderly. When the pixel arrangement structure is applied to a display panel, the resolution of the display panel is significantly increased.

In an embodiment, on the basis of the foregoing implementations, the plurality of pixel units 200 are arranged in an array, and the first side 101 is parallel to the row direction or the column direction of the pixel unit array. The plurality of pixel units 200 are arranged in the array, which means that the plurality of pixel units 200 may be arranged in rows in the row direction and arranged in columns in the column direction, or means that the plurality of pixel units 200 may be arranged in rows in the row direction, and pixel units of adjacent rows are arranged in a staggered manner in the column direction.

In an embodiment, on the basis of the foregoing implementations, in each of the pixel groups, two third sub-pixels 113 are arranged along the direction of the second side 102. Referring to FIGS. 7 to 10 for details, the two third sub-pixels 113 may be arranged in alignment along the direction of the second side 102, or may be arranged in a staggered manner in the direction of the second side 102. In an embodiment, in the direction of the second side 102, the overall size of the two third sub-pixels 113 is substantially the same as the size of the second sub-pixel 112. In a direction parallel to the first side 101, the overall size of the second sub-pixel 112 and one of the third sub-pixels 113 is the same as the size of the first sub-pixel 111.

In an embodiment, the third sub-pixel 113 is in a shape of a circular (FIG. 8), a square (FIG. 10), a triangle (FIG. 7), or a right-angled trapezoid (FIG. 9), and the shapes of the two third sub-pixels 113 are identical. In an embodiment, the two third sub-pixels 113 are arranged to respectively intersect the third side 103 of the virtual quadrilateral 100, namely, an outer boundary of each of the two third sub-pixels intersects the third side of the virtual quadrilateral. The third side 103 is parallel to the second side 102. Specifically, the two third sub-pixels 113 are arranged to respectively intersect the third side 103 of the virtual quadrilateral 100, that is to say, an edge of the third sub-pixel 113 touches the third side 103.

As shown in FIGS. 1 and 4, in an embodiment, on the basis of the foregoing implementations, in the pixel unit array, in two adjacent pixel groups in the first direction, two first sub-pixels 111 are arranged in a staggered manner in the first direction. In an embodiment, as shown in FIG. 4, in any two adjacent pixel groups that are arranged to extend along the first direction, distances a and b between projections of the centers of any two adjacent first sub-pixels 111 on the first direction are equal to each other. In an embodiment, the distances between the centers of any two adjacent first sub-pixels 111 in any two adjacent pixel groups are equal to each other.

In this embodiment, in the pixel groups arranged to extend in the first direction, the distances between projections of the centers of any two adjacent first sub-pixels 111 in any two adjacent pixel groups on the first direction are equal to each other, so that the arrangement manner of the sub-pixels in the pixel arrangement structure is more orderly and compact. When the pixel arrangement structure is applied to a display panel, the resolution of the display panel can be significantly improved.

In an embodiment, as shown in FIG. 1, $X_1$ denotes a vertical distance between the two second sub-pixels 112 in two adjacent pixel groups along the second direction, and $Y_1$ denotes a horizontal distance between two second sub-pixels 112 in two adjacent pixel groups along the first direction, and $Y_1=X_1$, or $Y_1=2X_1$.

Three sub-pixels of different colors form one sub-pixel unit. In FIGS. 2, 3, 5, and 6, the three sub-pixels of one same sub-pixel unit are connected with a triangle to show one same sub-pixel shared between different sub-pixel units. In an embodiment, as shown in FIG. 2, the first sub-pixel 111 and the second sub-pixel 112 in each of the pixel groups are individually shared between two adjacent sub-pixel units. Along the second direction, $X_2$ denotes a vertical distance between two second sub-pixels 112 in two adjacent pixel groups, and $Y_2$ denotes a horizontal distance between two first sub-pixels 111 in two adjacent pixel groups along the first direction, and $Y_2=X_2$, or $Y_2=2X_2$.

In an embodiment, as shown in FIG. 4, $X_4$ denotes a vertical distance between the two first sub-pixels 111 in two adjacent pixel groups in the first direction, and $Y_4$ denotes a horizontal distance between the two first sub-pixels 111 in two adjacent pixel groups in the second direction. The specific relationship between $Y_4$ and $X_4$ can be configured according to actual needs. In an embodiment, it is configured that $Y_4=X_4$ or $Y_4=2X_4$. In the process of forming the display panel, $Y_4=2X_4=2$ pitch, where the pitch is the ratio of a size of the display panel in the first direction or the second direction to the resolution in a corresponding direction.

In an embodiment, as shown in FIG. 5, $X_5$ denotes a vertical distance between the centers of the two second sub-pixels 112 in two adjacent pixel groups in the first direction, and $Y_5$ denotes a horizontal distance between the centers of the two second sub-pixels 112 in two adjacent pixel groups in the second direction, and $Y_5=X_5$, or $Y_5=2X_5$.

In some embodiments of the present disclosure, a distance between centers of two sub-pixels in one direction is a distance between starting edges of the two sub-pixels in this direction.

In an embodiment, as shown in FIG. 3, $X_3$ denotes the vertical distance between two adjacent first sub-pixels 111 in the second direction, and $Y_3$ denotes the horizontal distance between two adjacent second sub-pixels 112 in the first direction. In an embodiment, it is configured that $Y_3=X_3$ or $Y_3=2X_3$. In the process of forming the display panel, 1 pitch=$x/\sqrt{2}$ or 1 pitch=$y/\sqrt{2}$, where the pitch is the ratio of the size of the display panel in the first direction or the second direction to the resolution in the corresponding direction.

In some embodiments of the present disclosure, along the first direction or along the second direction, any two adjacent pixel groups 1001, 1002 are arranged to form three sub-pixel units with different arrangement structures.

In an embodiment of the present disclosure, as shown in FIG. 2, a pixel driving method is provided with reference to the pixel arrangement structure 10 of FIG. 1.

The pixel driving method includes step S100, forming a sub-pixel unit. The forming the sub-pixel unit specifically includes the following steps.

Along the second direction, three sub-pixel units are formed in two adjacent first pixel groups 1001 and in two adjacent second pixel groups 1002 respectively. As shown in FIG. 2, a first sub-pixel unit 211, a second sub-pixel unit 212, and a third sub-pixel unit 213 are formed in the two adjacent second pixel groups 1002 along the second direction. A fourth sub-pixel unit 221, a fifth sub-pixel unit 222, and a sixth sub-pixel unit 223 are formed in the two adjacent first pixel groups 1001 along the second direction.

In this embodiment, on the basis of the provided pixel arrangement structure 10 of FIG. 1, a pixel sharing method is provided. In this method, the sub-pixels form sub-pixel units along the second direction, and a sub-pixel is shared between two adjacent sub-pixel units. As some sub-pixels are shared with an adjacent one of the sub-pixel units, the pixel density per unit area can be increased to achieve a higher resolution of the display panel. In an embodiment, it is satisfied that in the first direction, $Y_2=2X_2$. In the process of forming the display panel, it is configured that $y=2x=2$ pitch, where the pitch is the ratio of the size of the display panel in the first direction or the second direction to the resolution in the corresponding direction. In this configuration, fewer sub-pixels are arranged in the physical structure, but pixel display with a higher resolution can be realized. For the pixel arrangement structures shown in FIGS. 1 and 4 in the present disclosure, other pixel sharing manners can also be employed, which can be specifically configured according to actual requirements for the resolution of display panel.

As shown in FIG. 3, in an embodiment of the present disclosure, a pixel driving method is provided with reference to the pixel arrangement structure 10 of FIG. 1.

The pixel driving method further includes step S300, forming a sub-pixel unit. The forming the sub-pixel unit specifically includes the following steps.

Along the first direction, that is, the horizontal direction or the extending direction of the first side 101, the adjacent second pixel group 1002 and the first pixel group 1001 are arranged in a first sequence to form a first smallest pixel unit 230, or the adjacent first pixel group 1001 and second pixel group 1002 are arranged in a second sequence to form the second smallest pixel unit 240. Three sub-pixel units are formed in each of the first smallest pixel units 230 or in each of the second smallest pixel units 240.

In the first smallest pixel unit 230, one first sub-pixel 111, one second sub-pixel 112, and one third sub-pixel 113 that are proximate to each other in the second pixel group 1002, form a seventh sub-pixel unit 231.

In the first smallest pixel unit 230, another third sub-pixel 113 in the second pixel group 1002, and one first sub-pixel 111 and one second sub-pixel 112 which are in the first pixel group 1001 form an eighth sub-pixel unit 232. There is no pixel shared between the seventh sub-pixel unit 231 and the eighth sub-pixel unit 232.

In the first smallest pixel unit 230, one first sub-pixel 111, one second sub-pixel 112, and one third sub-pixel 113 that are proximate to each other in the first pixel group 1001 form a ninth sub-pixel unit 233. The eighth sub-pixel unit 232 and the ninth sub-pixel unit 233 share the first sub-pixel 111 and the second sub-pixel 112 in the first pixel group 1001.

Along the first direction, the adjacent first pixel group 1001 and the second pixel group 1002 are arranged in the second sequence to form the second smallest pixel unit 240. Three sub-pixel units are formed in each of the second smallest pixel units 240.

One first sub-pixel 111, one second sub-pixel 112, and one third sub-pixel 113 that are proximate to each other in the first pixel group 1001 form a tenth sub-pixel unit 241.

Another third sub-pixel 113 in the first pixel group 1001, and one first sub-pixel 111 and one second sub-pixel 112 in the second pixel group 1002 form an eleventh sub-pixel unit 242. No sub-pixel is shared between the tenth sub-pixel unit 241 and the eleventh sub-pixel unit 242.

One first sub-pixel 111, one second sub-pixel 112, and one third sub-pixel 113 that are proximate to each other in the second pixel group 1002 form a twelfth sub-pixel unit 243. The eleventh sub-pixel unit 242 and the twelfth sub-pixel unit 243 share the first sub-pixel 111 and the second sub-pixel 112 in the second pixel group 1002.

At step S400, a pixel drive control circuit drives the seventh sub-pixel unit 231, the eighth sub-pixel unit 232, the ninth sub-pixel unit 233, the tenth sub-pixel unit 241, the eleventh sub-pixel unit 242 and the twelfth sub-pixel unit 243 to display and emit light.

In this embodiment, on the basis of the pixel arrangement structure 10 of FIG. 1, the driving method with shared pixels is provided. Through this method, the sub-pixels form sub-pixel units along the first direction, and sub-pixels are shared between the sub-pixel units. With the shared pixels, the pixel density per unit area can be increased to achieve a higher resolution in the display panel. In an embodiment, it is configured that, in the first direction, $Y_3=X_3$. In the process of forming the display panel, 1 pitch=$x/\sqrt{2}$ or 1 pitch=$y/\sqrt{2}$, where the pitch is the ratio of the size of the display panel in the first direction or the second direction to the resolution in the corresponding direction. In this way, fewer sub-pixels are arranged in the physical structure, but the pixel display with a higher resolution can be realized.

In an embodiment, as shown in FIG. 1, the first sub-pixel 111 is arranged to extend along the first direction, and the second sub-pixel 112 is arranged to extend along the second direction.

Specifically, shapes of the first sub-pixels 111 may be one or more of a triangle, a rectangle, a polygon (such as a hexagon or an octagon), a circle, an ellipse, or other irregular shapes. A shape and a size of the second sub-pixel 112 may be configured to be the same as the shape and the size of the first sub-pixel 111 respectively.

In this embodiment, the extending direction of the first sub-pixel 111 and the extending direction of the second sub-pixel 112 are limited, so that the areas occupied by the sub-pixels in the pixel group may be more reasonable. The arrangement of the sub-pixels in the pixel arrangement structure 10 is more reasonable, and the number of pixels per inch in the pixel arrangement is larger.

Referring to FIG. 1, in an embodiment, in each pixel unit 200 arranged to extend along the first direction, the first sub-pixels 111 are arranged in a staggered manner in the first direction. All second sub-pixels 112 in the same pixel group column s extending along the second direction are arranged in a straight line. In this embodiment, the first sub-pixels 111 in each of the pixel units 200 are arranged in a staggered manner in the first direction, which is beneficial to optimization of the display effect of the pixel arrangement structure.

In an embodiment, the first sub-pixel 111 is a blue sub-pixel. The second sub-pixel 112 is a red sub-pixel. The third sub-pixel 113 is a green sub-pixel.

In this embodiment, according to different service lives, different display capabilities, and different display requirements of the three primary colors of RGB in actual display, a color of each sub-pixel in the pixel arrangement structure 10 is configured reasonably, so that a higher color saturation of the pixel arrangement structure 10 can be ensured during the display and light-emitting process.

In an embodiment, the area of the first sub-pixel 111 is larger than the area of the second sub-pixel 112, and the area of the first sub-pixel 111 is larger than the area of the third sub-pixel 113.

In this embodiment, the area of the blue sub-pixel is larger than the area of the red sub-pixel, and the area of the red sub-pixel is larger than the area of the green sub-pixel. In the pixel group, it can be understood that the area of the first sub-pixel 111 (blue) is larger than the area of the second sub-pixel 112 (red). The area of the second sub-pixel 112 (red) is larger than the area of the third sub-pixel 113 (green).

In this embodiment, such configuration enables the display effect of the pixel arrangement structure 10 to be better. With the advancement of science and technology in the future, and with the development of new technologies and the discovery of new luminescent materials, the display capability may be changed, and the area of the first sub-pixel 111, the area of the second sub-pixel 112, and the area of the third sub-pixel 113 are not necessarily limited to this embodiment. The area of the first sub-pixel 111, the area of the second sub-pixel 112, and the area of the third sub-pixel 113 can be arbitrarily adjusted according to display requirements, so as to adjust the area of the corresponding pixel unit 200 to meet the display requirements.

In an embodiment, the two third sub-pixels 113 have a same size and a same shape, and the sum of the areas of the two third sub-pixels 113 is greater than or equal to the area of the second sub-pixel 112, and is less than or equal to the area of the first sub-pixel 111.

In this embodiment, the areas of the first sub-pixel 111, the second sub-pixel 112, and the third sub-pixel 113 in the pixel group are configured reasonably, so that the color of each sub-pixel in the pixel arrangement structure 10 can be displayed normally and uniformly.

In an embodiment, the pixel groups have a same shape and have a same area.

In this embodiment, all pixel groups in the pixel arrangement structure 10 have the same shape and the same area, so that when the pixel arrangement structure 10 is applied to a display panel, the display effect of each sub-pixel unit is uniform, and the display of the display panel is more uniform.

Referring to FIG. 4, a pixel arrangement structure 10 is provided. The pixel arrangement structure 10 includes a plurality of pixel units 200. Each of the pixel units 200 is two pixel groups, that is, a first pixel group 2001 and a second pixel group 2002.

Each of the pixel groups includes: one first sub-pixel 111, one second sub-pixel 112, and two third sub-pixels 113. The four sub-pixels in each pixel group are all located within a virtual quadrilateral 101. Each of the pixel units 200 is two pixel groups, which have a first pixel group 2001 and a second pixel group 2002 arranged along the first direction in sequence. After the first pixel group rotates for 180 degrees in the plane, the pixel arrangement of the first pixel group 2001 is mirror-symmetrical to the pixel arrangement of the second pixel group 2002.

In an embodiment, as shown in FIG. 4, in the pixel unit array, in any two adjacent pixel groups arranged to extend in the first direction, distances a and b between projections of the centers of any two adjacent first sub-pixels 111 on the first direction (that is, vertical distances between the centers of any two adjacent first sub-pixels 111, are equal to each other. In this embodiment, the projection distances of the distances between the centers of the any two adjacent first sub-pixels 111 on the first direction are equal to each other, so that the arrangement of the pixel arrangement structure is more compact and the display is more uniform.

In this embodiment, the arrangement of the sub-pixels is reasonably configured. The pixel arrangement structure of FIG. 4 may also be implemented with a structure that including RGBG sub-pixels in a pixel group, thereby making the pixel arrangement structure 10 more compact. When the pixel arrangement structure 10 is applied to a display panel, the resolution of the display panel can be significantly improved.

In an embodiment, as shown in FIGS. 3 and 6, along the first direction, each of the first sub-pixels 111 is shared between two adjacent sub-pixel units. Each of the second sub-pixels 112 is shared between two adjacent sub-pixel units. As shown in FIGS. 2 and 5, along the second direction, each of the first sub-pixels 111 is shared between two adjacent sub-pixel units, and each of the second sub-pixels 112 is shared between two adjacent sub-pixel units. Each of the sub-pixel units includes a shared first sub-pixel 111, a shared second sub-pixel 112, and an independent third sub-pixel 113.

In this embodiment, on the basis of the pixel arrangement structures 10 of FIGS. 1 and 4, the sub-pixel units are illustrated by triangles. The reasonable arrangement of the pixel arrangement structure makes the driving circuit for the pixel display simpler and improves the overall driving capability of the screen.

As shown in FIG. 5, one pixel unit 200 is two pixel groups. In the first row of the pixel unit array, two adjacent pixel groups arranged along the second direction (that is, the row direction) form three sub-pixel units. In the last row of the pixel unit array, two adjacent pixel groups arranged along the second direction (that is, the row direction) form three sub-pixel units. As shown in FIG. 6, one pixel unit 200 is two pixel groups. In the first column of the pixel unit array, two adjacent pixel groups arranged along the first direction (that is, the column direction) form a third smallest pixel unit 270. In the last column of the pixel unit array, two adjacent pixel groups arranged along the first direction (that is, the column direction) form a fourth smallest pixel unit 280.

In the third smallest pixel unit 270 and the fourth smallest pixel unit 280, each first sub-pixel 111 is shared between two adjacent sub-pixel units. Each second sub-pixel 112 is shared between two adjacent sub-pixel units. Each sub-pixel unit includes one shared first sub-pixel 111, one shared second sub-pixel 112, and one independent third sub-pixel 113. The two third sub-pixels 113 in each of the pixel groups are not shared.

The sub-pixel unit is the smallest unit capable of performing pixel display. One sub-pixel unit includes sub-pixels of at least three primary colors of red, green, and blue. The sub-pixels of the three primary colors of red, green, and blue may be shared between two adjacent sub-pixel units. In the pixel arrangement structures shown in FIGS. 1 to 6 of the present disclosure, none of the third sub-pixels 113 are shared.

Please refer to FIG. 11, in an embodiment, the present disclosure provides a display panel 20 including a substrate 21 and the pixel arrangement structure 10 disposed on the substrate 21.

The substrate 21 may be hard screen glass or flexible screen polyimide. A thin film transistor circuit layer is disposed on a surface of the substrate 21. The pixel arrangement structure 10 may be layered on a surface of the thin film transistor circuit layer, and the thin film transistor circuit layer may control the sub-pixels in the pixel arrangement structure 10 as required.

The pixel arrangement structure 10 may be the pixel arrangement structure shown in FIG. 1 or FIG. 4. The pixel arrangement structure 10 shown in FIG. 1 may be driven to display according to the pixel driving method shown in FIG. 2 or FIG. 3. The pixel arrangement structure 10 shown in FIG. 4 may be driven to display according to the pixel driving method shown in FIG. 5 or FIG. 6.

Of course, display panel 20 may further include a thin film transistor circuit layer and an encapsulation layer. The display panel 20 may be used to manufacture a display device for a smartphone, a tablet computer, a car audio device, or any other display device using a display panel. For example, the display panel 20 may also be used to produce a smart billboard.

In this embodiment, in order to achieve different display effects, the pixel arrangement structure 10 in the display panel 20 can be arranged according to the pixel structures in the above embodiments shown in FIGS. 1 and 4.

The substrate 21 has an aligning side 201. When the pixel arrangement structure 10 is arranged on the substrate 21, the second side 103 and the aligning side form an included angle greater than 0 degree and less than 360 degrees. In an embodiment, the included angle between the second side 103 and the aligning side 201 is 90 degrees, 180 degrees, or 270 degrees.

In this embodiment, the included angle between the second side 103 and the aligning side 201 may be configured according to the shape and the structure of the display panel 20. It may also be said that the rotation angle of the pixel arrangement structure 10 is configured according to the shape and the structure of the display panel 20. In addition, it may be understood that, in the pixel arrangement structures 10 of FIGS. 1 to 6 of the present disclosure, the distances between the sub-pixels may not be configured according to the distance relationships in the figures. FIGS. 1 to 6 only show the relative position relationship of four sub-pixels in a pixel unit.

The present disclosure further provides a method for manufacturing a pixel arrangement structure, which includes: providing a substrate 21, depositing a thin film transistor (TFT) on the substrate 21, depositing an anode on a surface of the thin film transistor, and depositing organic light-emitting units and a pixel defining layer (functioning as sub-pixels) on the anode. In the process of depositing the organic light-emitting units and the pixel defining layer, the deposition can be performed according to the pixel arrangement structures shown in FIGS. 1 to 6 in the present disclosure.

The frame lines at the outer boundary the sub-pixels in the present disclosure do not have practical meanings, but are merely illustrative, and are used to more clearly illustrate the arrangement positions of the sub-pixels. In the process of manufacturing the display panel, such frame lines will not be manufactured. The technical features of the above-described embodiments can be combined arbitrarily. To simplify the description, not all possible combinations of the technical features in the above embodiments are described. However, all of the combinations of these technical features should be considered within the scope of the present disclosure, as long as such combinations do not contradict each other.

The above-described embodiments merely represent embodiments of the present disclosure, and the descriptions thereof are more specific and detailed, but they should not be construed as limiting the scope of the present disclosure. It should be noted that for those of ordinary skill in the art, various modifications and improvements can be made without departing from the concept of the present disclosure and the modifications and improvements are all within the protection scope of the present disclosure. Therefore, the protection scope of the present disclosure shall be subject to the appended claims.

What is claimed is:

1. A pixel arrangement structure, comprising a plurality of identical pixel units,
   each of the plurality of pixel units comprising at least one pixel group, and
   each of the at least one pixel group comprising one first sub-pixel, one second sub-pixel, and two third sub-pixels forming a virtual quadrilateral thereamong;
   wherein a longest side of the first sub-pixel is arranged to at least partially overlap a first side of the virtual quadrilateral, a longest side of the second sub-pixel is arranged to at least partially overlap a second side of the virtual quadrilateral, and the first side and the second side of the virtual quadrilateral intersect with each other;
   in two adjacent pixel groups in a second direction, a vertical distance between two second sub-pixels is $X_1$, and in two adjacent pixel groups along a first direction, a horizontal distance between two second sub-pixels is $Y_1$; wherein $Y_1=X_1$;
   the first direction is parallel to an extending direction of the first side; and
   the second direction is perpendicular to the first direction.

2. The pixel arrangement structure according to claim 1, wherein:
   the at least one pixel group is two pixel groups arranged in sequence along a first direction having a first pixel group and a second pixel group; and
   after the first pixel group rotates for 180 degrees, a pixel arrangement of the first pixel group is mirror-symmetrical to a pixel arrangement of the second pixel group.

3. The pixel arrangement structure according to claim 2, wherein the first direction is parallel to an extending direction of the first side.

4. The pixel arrangement structure according to claim 3, wherein in each of the plurality of pixel units arranged to extend along the first direction, the first sub-pixels are arranged in a staggered manner in the first direction.

5. The pixel arrangement structure according to claim 4, wherein in any two adjacent pixel groups arranged to extend along the first direction, distances between projections of centers of any two adjacent first sub-pixels on the first direction are equal to each other.

6. The pixel arrangement structure according to claim 4, wherein distances between centers of adjacent first sub-pixels in any two adjacent pixel groups are equal to each other.

7. The pixel arrangement structure according to claim 1, wherein the plurality of pixel units are arranged in an array and the first side is parallel to a row direction or a column direction of the array.

8. The pixel arrangement structure according to claim 1, wherein:
   in one of the at least one pixel group, the two third sub-pixels are arranged in a direction parallel to the second side; and
   the two third sub-pixels have a same shape as a square, a triangle or a right-angled trapezoid.

9. The pixel arrangement structure according to claim 8, wherein a sum of areas of the two third sub-pixels is greater than or equal to an area of the second sub-pixel and less than or equal to an area of the first sub-pixel.

10. The pixel arrangement structure according to claim 8, wherein an outer boundary of each of the two third sub-pixels intersects a third side of the virtual quadrilateral and the third side is parallel to the second side.

11. The pixel arrangement structure according to claim 1, wherein:
    in two pixel groups in a second direction, a vertical distance between two second sub-pixels is $X_2$, and in two adjacent pixel groups along a first direction, a horizontal distance between two second sub-pixels is $Y_2$; wherein $Y_2=X_2$;
    the first direction is parallel to an extending direction of the first side; and
    the second direction is perpendicular to the first direction.

12. The pixel arrangement structure according to claim 1, wherein:
    a vertical distance between two adjacent first sub-pixels in a second direction is $X_3$ and a horizontal distance between two adjacent second sub-pixels in a first direction is $Y_3$; wherein $Y_3=X_3$;
    the first direction is parallel to an extending direction of the first side; and
    the second direction is perpendicular to the first direction.

13. The pixel arrangement structure according to claim 1, wherein:
    along a first direction or along a second direction, any two adjacent pixel groups are arranged to form three sub-pixel units with different arrangement structures;
    the first direction is parallel to an extending direction of the first side; and
    the second direction is perpendicular to the first direction.

14. A display panel, comprising:
    a substrate; and
    the pixel arrangement structure of claim 1;
    wherein the pixel arrangement structure is arranged on the substrate.

15. The display panel according to claim 14, wherein the substrate comprises an aligning side, and the second side of the virtual quadrilateral in each of the at least one pixel group and the aligning side has an angle greater than 0 degree and less than 360 degrees.

16. The display panel according to claim 15, wherein an included angle between the second side and the aligning side is 90 degrees, 180 degrees or 270 degrees.

17. The display panel according to claim 14, further comprising a pixel drive control circuit, wherein:
    along a first direction or along a second direction, any two adjacent pixel groups are arranged to form three sub-pixel units with different arrangement structures;
    the first direction is parallel to an extending direction of the first side;
    the second direction is perpendicular to the first direction;
    the pixel drive control circuit is configured to drive the first sub-pixel and the second sub-pixel in each pixel group to be shared between two adjacent sub-pixel units;
    each of the sub-pixel units comprises one first sub-pixel and one second sub-pixel driven by the pixel drive control circuit to be shared between two adjacent sub-pixel units, and further comprises one independent third sub-pixel; and the first sub-pixel is a blue sub-pixel, the second sub-pixel is a red sub-pixel, and the third sub-pixel is a green sub-pixel.

18. A pixel arrangement structure, comprising a plurality of identical pixel units,
   each of the plurality of pixel units comprising at least one pixel group, and
   each of the at least one pixel group comprising one first sub-pixel, one second sub-pixel, and two third sub-pixels forming a virtual quadrilateral thereamong;
   wherein a longest side of the first sub-pixel is arranged to at least partially overlap a first side of the virtual quadrilateral, a longest side of the second sub-pixel is arranged to at least partially overlap a second side of the virtual quadrilateral, and the first side and the second side of the virtual quadrilateral intersect with each other;
   in two adjacent pixel groups in a first direction, a vertical distance between two first sub-pixels is $X_4$, and in two adjacent pixel groups in a second direction, a horizontal distance between two first sub-pixels is $Y_4$; wherein $Y_4=2X_4$;
   the first direction is parallel to an extending direction of the first side; and
   the second direction is perpendicular to the first direction.

19. The pixel arrangement structure according to claim 18, wherein:
   in two adjacent pixel groups in a first direction, a vertical distance between centers of two second sub-pixels is $X_5$, and in two adjacent pixel groups in a second direction, a horizontal distance between centers of two second sub-pixels is $Y_5$; wherein $Y_5=2X_5$;
   the first direction is parallel to an extending direction of the first side; and
   the second direction is perpendicular to the first direction.

20. A pixel arrangement structure, comprising a plurality of identical pixel units,
   each of the plurality of pixel units comprising at least one pixel group, and
   each of the at least one pixel group comprising one first sub-pixel, one second sub-pixel, and two third sub-pixels forming a virtual quadrilateral thereamong;
   wherein a longest side of the first sub-pixel is arranged to at least partially overlap a first side of the virtual quadrilateral, a longest side of the second sub-pixel is arranged to at least partially overlap a second side of the virtual quadrilateral, and the first side and the second side of the virtual quadrilateral intersect with each other; and
   in each of the at least one pixel group, in a direction of a longest side of the first sub-pixel, the first sub-pixel is arranged in a row, and the second sub-pixel and the two third sub-pixels are arranged in another row.

* * * * *